(12) United States Patent
Lee et al.

(10) Patent No.: US 12,349,600 B2
(45) Date of Patent: Jul. 1, 2025

(54) MAGNETIC TUNNEL JUNCTION (MTJ) ELEMENT AND ITS FABRICATION PROCESS

(71) Applicant: TAIWAN SEMICONDUCTOR MANUFACTURING COMPANY LTD., Hsinchu (TW)

(72) Inventors: Ya-Ling Lee, Hsinchu (TW); Tsann Lin, Hsinchu (TW); Han-Jong Chia, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 18/770,678

(22) Filed: Jul. 12, 2024

(65) Prior Publication Data

US 2024/0365676 A1 Oct. 31, 2024

Related U.S. Application Data

(60) Continuation of application No. 18/331,154, filed on Jun. 7, 2023, now Pat. No. 12,069,961, which is a division of application No. 17/070,426, filed on Oct. 14, 2020, now Pat. No. 11,716,909.

(51) Int. Cl.
| | |
|---|---|
| *H10N 50/10* | (2023.01) |
| *G01R 33/09* | (2006.01) |
| *G11C 11/16* | (2006.01) |
| *H10B 61/00* | (2023.01) |
| *H10N 50/01* | (2023.01) |
| *H10N 50/80* | (2023.01) |
| *H10N 50/85* | (2023.01) |

(52) U.S. Cl.
CPC ............ *H10N 50/10* (2023.02); *G01R 33/093* (2013.01); *G01R 33/098* (2013.01); *G11C 11/161* (2013.01); *H10B 61/00* (2023.02); *H10N 50/01* (2023.02); *H10N 50/80* (2023.02); *H10N 50/85* (2023.02)

(58) Field of Classification Search
CPC ........ H10N 50/10; H10N 50/80; H10N 50/85; G01R 33/093; G01R 33/098; G11C 11/161; H10B 61/00; H10B 61/22
See application file for complete search history.

(56) References Cited

U.S. PATENT DOCUMENTS

2020/0006425 A1  1/2020 Lin et al.
2021/0005809 A1* 1/2021 Ma ...................... G01R 33/098

* cited by examiner

*Primary Examiner* — Shih Tsun A Chou
(74) *Attorney, Agent, or Firm* — WPAT LAW; Anthony King

(57) ABSTRACT

A magnetic tunnel junction (MTJ) element is provided. The MTJ element includes a hard bias layer, a reference layer disposed over the hard bias layer, a tunnel barrier layer disposed over the reference layer, a free layer disposed over the tunnel barrier layer, and a diffusion barrier layer disposed over the free layer wherein the diffusion barrier layer comprises an amorphous and nonmagnetic film of a form X-Z, where X is Fe or Co and Z is Hf, Y, or Zr. The MTJ element in accordance with the present disclosure exhibits a low resistance desired for a low-power write operation, and a high TMR coefficient desired for a low bit-error-rate (BER) read operation.

20 Claims, 13 Drawing Sheets

MAGNETIC TUNNEL JUNCTION (MTJ) ELEMENT AND ITS FABRICATION PROCESS

CROSS REFERENCE TO RELATED APPLICATIONS

This application is a Continuation of U.S. application Ser. No. 18/331,154, filed on Jun. 7, 2023, which is a divisional application of U.S. patent application Ser. No. 17/070,426 filed on Oct. 14, 2020, entitled of "MAGNETIC TUNNEL JUNCTION (MTJ) ELEMENT AND ITS FABRICATION PROCESS"; this application is incorporated herein by reference in their entireties.

BACKGROUND

Many modern day electronic devices contain electronic memory, such as hard disk drives or random access memory (RAM). Electronic memory may be volatile memory or non-volatile memory. Non-volatile memory is able to retain its stored data in the absence of power, whereas volatile memory loses its data memory contents when power is lost. Magnetic tunnel junctions (MTJs) can be used in hard disk drives and/or RAM, and thus are promising candidates for next generation memory solutions. A magnetic random access memory (MRAM) device is currently explored to facilitate a static random access memory (SRAM) to own a high non-volatile storage density. The MRAM device includes an array of densely packed MRAM cells. In each MRAM cell, a magnetic tunnel junction (MTJ) element is integrated with a transistor to perform write and read operations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
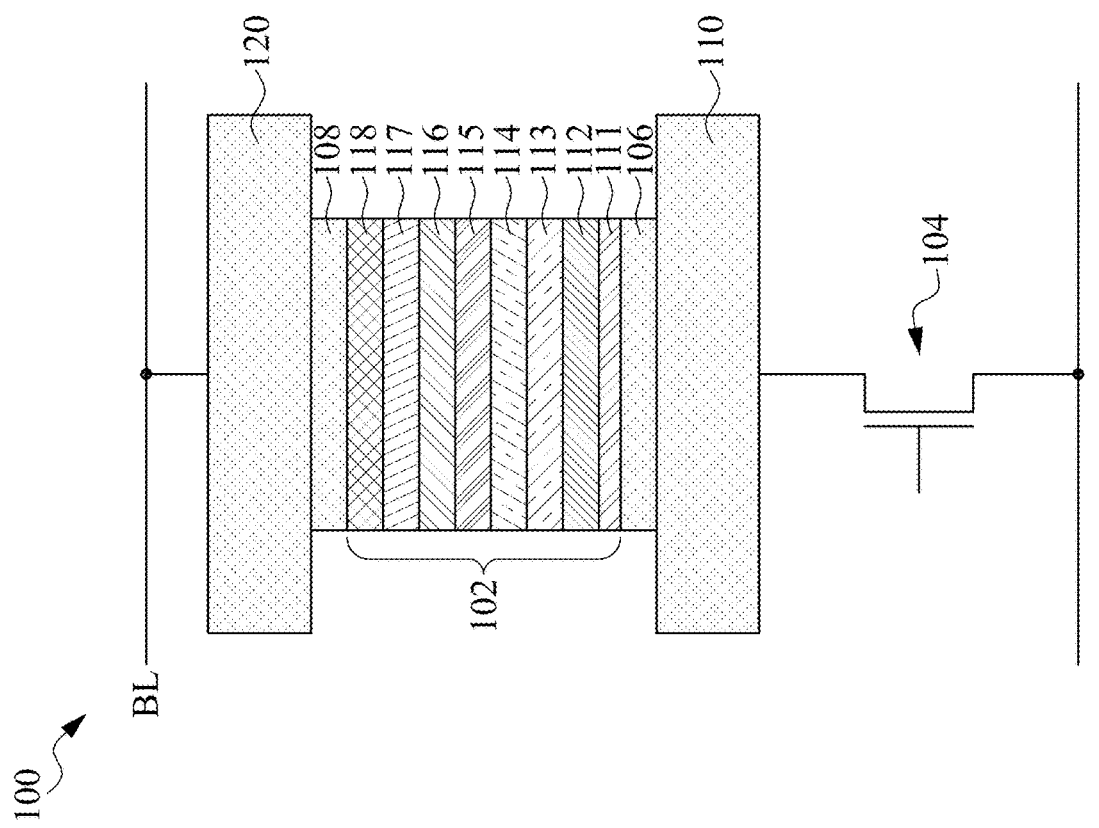
FIG. 1 illustrates a schematic view of some embodiments of a semiconductor device including a magnetic tunnel junction (MTJ) element according to the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

A magnetic tunnel junction (MTJ) element includes first and second ferromagnetic films separated by a tunnel barrier layer. One of the ferromagnetic films (often referred to as a "reference layer") has a fixed magnetization direction, while the other ferromagnetic film (often referred to as a "free layer") has a variable magnetization direction. If the magnetization directions of the reference layer and free layer are in a parallel orientation, it is more likely that electrons will tunnel through the tunnel barrier layer, such that the MTJ element is in a low-resistance state. Conversely, if the magnetization directions of the reference layer and free layer are in an anti-parallel orientation, it is less likely that electrons will tunnel through the tunnel barrier layer, such that the MTJ element is in a high-resistance state. Consequently, the MTJ element can be switched between two states of electrical resistance, a first state with a low resistance (Rp: magnetization directions of reference layer and free layer are parallel) and a second state with a high resistance (RAP: magnetization directions of reference layer and free layer are anti-parallel). Because of this binary nature, MTJ elements are used in memory cells to store digital data, with the low resistance state RP corresponding to a first data state (e.g., logical "0"), and the high-resistance state RAP corresponding to a second data state (e.g., logical "1"). A performance of the MTJ element is measured by a product of resistance and area (RA), as well as a tunnel magnetoresistance (TMR) coefficient. The TMR coefficient is a ratio of (RAP-Rp)/Rp. The MTJ element is designed to have a low RA mainly for low-power write performance, and high TMR coefficient mainly for a broad read window between "0" and "1."

Typically, an MTJ element is disposed between a bottom electrode and a top electrode, and the reference layer, free layer, and tunnel barrier layer are manufactured to have a specific crystalline structure and orientation. In some embodiments, the reference layer and the free layer may be made with a body-centered-cubic (bcc) structure with (001) orientation. To attempt to form the MTJ element has this structure and orientation, the tunnel barrier layer having a specific crystalline orientation is applied between the reference layer and the free layer as a template so that the crystalline orientation can be grown in the reference layer and the free layer by a post-annealing process. For example, a bcc (001)-textured manganese oxide (MgO) layer can be applied between an amorphous reference layer and an amorphous free layer to induce crystallization of the reference layer and the free layer with (001) orientation during the annealing process. To form a better free-layer crystalline, the MTJ element can be formed with a dual MgO structure, i.e., by applying an additional MgO layer on a top of the free layer. However, during the high temperature annealing process, the oxygen atoms in the MTJ element may diffuse out through crystalline grain boundaries and may migrate towards and be absorbed by elements having high oxygen affinity, such as tantalum (Ta), tungsten (W) or molybdenum (Mo), which adversely affects the RA and TMR coefficient of the MTJ element.

The present disclosure therefore provides an MTJ element which includes a diffusion carrier layer formed over the free layer as a cap layer. In some embodiments, the diffusion carrier layer of the cap layer includes an amorphous, non-magnetic film of the form X-Z (where X is iron (Fe), cobalt (Co), or the like, and Z is hafnium (Hf), yttrium (Y), zirconium (Zr), or the like). In some embodiments, it is found that the resulting MTJ element has a lower RA and a greater magnetoresistance (TMR) coefficient. Consequently, the performance of the MTJ element is improved. The present disclosure also provides a semiconductor device (e.g., a memory device) including the MTJ element and a method for fabricating the MTJ element and the semiconductor device.

FIG. 1 is a schematic view of a semiconductor device 100 in accordance with some embodiments of the present disclosure. The semiconductor device 100 may be a memory device. The semiconductor device 100 includes an MTJ element 102 and an access transistor 104. The MTJ element 102 is disposed between a bottom electrode 106 and a top electrode 108. The access transistor 104 is coupled to the MTJ element 102 by a first metal wire 110 disposed under a bottom electrode 106. A bit line (BL) is coupled to one end of the MTJ element 102 through a top electrode 108 disposed under a second metal wire 120, and a source line (SL) is coupled to an opposite end of the MTJ element 102 through the access transistor 104. Thus, application of a suitable word line (WL) voltage to a gate electrode of the access transistor 104 couples the MTJ element 102 between the BL and the SL. Consequently, by providing suitable bias conditions, the MTJ element 102 can be switched between two states of electrical resistance, a first state with a low resistance (magnetization directions of reference layer and free layer are parallel) and a second state with a high resistance (magnetization directions of reference layer and free layer are antiparallel), to store data.

The MTJ element 102 illustrated in FIG. 1 includes a buffer layer 111, a seed layer 112, a hard bias layer 113, an antiparallel coupling (APC) layer 114, a reference layer 115, a tunnel barrier layer 116, a free layer 117, and a cap layer 118. The reference layer 115 and the free layer 117 are separated by the tunnel barrier layer 116. The reference layer 115 has a fixed magnetization, while the free layer 117 has a variable magnetization that can be switched to change between two binary data states for the MTJ element 102. The hard bias layer 113 is arranged below the reference layer 115 to fix the magnetization of the reference layer 115 through anti-parallel coupling induced by the antiparallel coupling (APC) layer 114 arranged between the reference layer 115 and the hard bias layer 113. In some embodiments, the APC layer 114 is optional and not a part of the MTJ element 102. The cap layer 118, which may also be referred to as a perpendicular magnetic anisotropy (PMA) protection layer in some contexts, is disposed over the free layer 117.

Figure 2A:
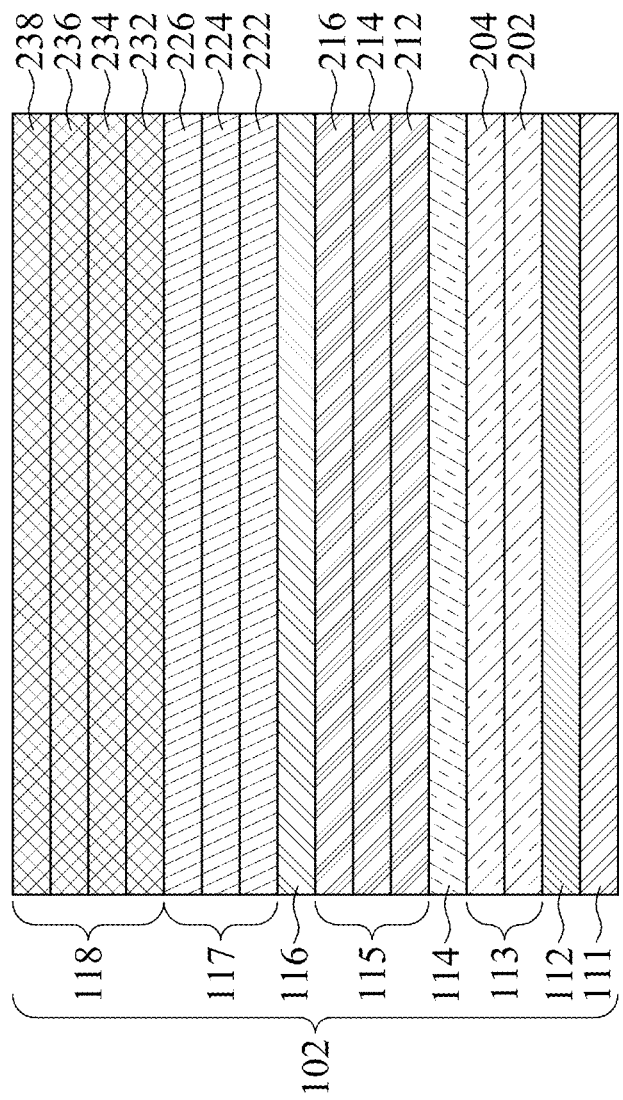
FIG. 2A illustrates a cross-sectional view of some embodiments of an MTJ element according to the present disclosure.

FIG. 2A shows a more detailed example of an MTJ element 102 in accordance with some embodiments.

The buffer layer 111 is disposed over the bottom electrode 106 and below the seed layer 112. In some embodiments, the buffer layer 111 is amorphous and can eliminate unwanted microstructural effects originated from the bottom electrode 106 and facilitate its overlying films to develop their own desired crystalline structures and orientations. In some embodiments, the buffer layer 111 is nonmagnetic so that it does not interact with the magnetics of its overlying films. In some embodiments, the buffer layer 111 may be or include tantalum nitride (TaNx), in which its nitrogen content can be adjusted to form an amorphous film to facilitate overlying films to grow independently and develop their own crystalline structures and orientations. In some embodiments, the buffer layer 111 may be or include an amorphous, nonmagnetic film of the form X-Z (where X is iron (Fc), cobalt (Co), or the like, and Z is hafnium (Hf), yttrium (Y), zirconium (Zr), or the like); and in further embodiments, the buffer layer 111 may be substantially free from Ta or other diffusive species (e.g., ruthenium (Ru)) which may diffuse during high temperature processes (e.g., annealing). In some embodiments, the buffer layer 111 is a Co—Hf film with an Hf content ranging from 18 atomic percentage (at. %) to 40 at. % (e.g., 18 at. %, 20 at. %, 25 at. %, 30 at. %, 35 at. % or 40 at. %). The Co—Hf film may have an Co content ranging from 60 at. % to 82 at. % (e.g., 60 at. %, 65 at. %, 70 at. %, 75 at. %, 80 at. % or 82 at. %). A Co—Hf film with a Hf content of 18 at. % may have 18 percent of the number of atoms in the Co—Hf film as Hf, and 82 percent of the number of atoms in the Co—Hf film as Co; however, in some embodiments, other atoms such as nitrogen may be doped in the Co—Hf film such that the Co content may be lower than 82 at. %. Hf (or Y, or Zr) atoms are much larger than Co (or Fe) atoms, and thus may distort crystalline lattices to form an amorphous phase. Similarly, nitrogen atoms are much smaller than Co (or Fe) atoms, and thus may also distort crystalline lattices to facilitate the formation of the amorphous phase. Without grain boundaries as diffusion paths, the buffer layer 111 may act as a diffusion barrier layer to prevent the hard bias layer 113 and other layers in the MTJ element 102 from diffusion of metallic atoms of the underlying bottom electrode. In some embodiments, the buffer layer 111 may have a smooth morphology and a thickness ranging from approximately 1 nm to approximately 10 nm.

The seed layer 112 is disposed over the buffer layer 111. In some embodiments, the seed layer 112 exhibits a face-centered-cubic (fcc) phase. In some embodiments, the thickness of the seed layer 112 can be adjusted so that the seed layer 112 exhibits a strong <111> crystalline texture for its overlying films to epitaxially grow, thereby also developing strong <111> crystalline textures. In some embodiments, the seed layer 112 may include materials such as nickel-chromium (Ni—Cr), nickel-iron-chromium (Ni—Fe—Cr), nickel-iron-nitrogen (Ni—Fe—N) or the like. In some embodiments, the seed layer 112 includes a nickel-chromium (Ni—Cr) film in a thickness of approximately 6 nm. The Cr content in the seed layer 112 may range from approximately 30 at. % to approximately 50 at. % and should be high enough to ensure that the seed layer 112 is nonmagnetic.

The hard bias layer 113 is disposed over the seed layer 112, which facilitates the hard bias layer 113 to develop a strong fcc <111> crystalline texture, thereby exhibiting a high perpendicular magnetic anisotropy (PMA) and a high coercivity (Hc). The hard bias layer 113 is a ferromagnetic material having a magnetization direction that is aligned or fixed when applying a high magnetic field in a direction perpendicular to film interfaces. In some embodiments, the hard bias layer 113 may include a laminated structure of N repeats of alternating Co and Pt films. In some embodiments, N is an integral number greater than one and may be within a range of 3 to 6, but is not limited thereto. For example, in the embodiments illustrated in FIG. 2A, the hard bias layer 113 may include a multilayer stack 202 composed of alternating Co and Pt films, and a further Co film 204 disposed over the multilayer stack 202. The multilayer stack 202 is disposed over the seed layer 112 and may have a structure expressed as [Co/Pt] n where n is an integral number within a range of 3 to 6 and each of the Co and Pt films may have a thickness within a range of 0.2 nm to 0.4 nm. The further cobalt film 204 may have a thickness within a range of 0.6 nm to 1 nm. The hard bias layer 113 may include any number of layers in any order with many suitable materials and thus FIG. 2A is merely an example.

In some embodiments, the MTJ element 102 may include an antiparallel coupling (APC) layer 114 disposed above the hard bias layer 113 and separates the hard bias layer 113 from the reference layer 115. The APC layer 114 ensures that the magnetization of the reference layer 115 is opposite to that of the hard bias layer 113 through antiparallel coupling effect. In some embodiments, the APC layer 114 may be made of Ru and have a thickness of approximately 0.4 nm or within a range of approximately 0.3 nm to 0.5 nm; or the APC layer 114 may be made of Ir and have a thickness of approximately 0.5 nm or within a range of approximately 0.4 nm to 0.6 nm.

The reference layer 115 is disposed over the APC layer 114. The reference layer 115 is a ferromagnetic layer and has a magnetization direction that is "hard-biased" (fixed) by the hard bias layer 113 through ferromagnetic coupling and/or antiferromagnetic coupling. In some embodiments, the magnetization direction of the reference layer 115 is opposite to that of the hard bias layer 113. In some embodiments, the reference layer 115 may include two ferromagnetic layers separated by a nonmagnetic layer. In some embodiments as illustrated in FIG. 2A, the reference layer 115 includes a first ferromagnetic layer 212 disposed over the APC layer 114, a nonmagnetic layer 214 disposed over the first ferromagnetic layer 212 and a second ferromagnetic layer 216 disposed over the nonmagnetic layer 214. In some embodiments, the reference layer 115 may include a cobalt (Co) film 212, a molybdenum (Mo) film 214 and an iron-boron (Fe—B) film 216. In some embodiments, a thickness of the Co film is within a range of approximately 0.6 nm to approximately 1 nm, a thickness of the Mo film is within a range of approximately 0.1 nm to approximately 0.4 nm, and a thickness of the Fe—B film is within a range of approximately 0.6 nm to approximately 1.4 nm.

The Co film of the reference layer 115 has no intrinsic PMA, and is antiparallel coupled with the underlying hard bias layer 113 across the APC layer 114 to exhibit an extrinsic PMA. A strong antiparallel coupling may be attained by continuing the epitaxial growth facilitated by the seed layer 112 and developing the strong fcc crystalline texture. In addition, the Mo film of the reference layer 115 exhibits a body-centered-cubic (bcc) phase which may terminate the epitaxial growth for its overlying Fe—B film of the reference layer 115 to grow with an amorphous phase.

The tunnel barrier layer 116, which can manifest as a thin dielectric layer film, is disposed over the reference layer and separates the reference layer 115 from the free layer 117. In some embodiments, the tunnel barrier layer 116 may include an amorphous film, such as aluminum oxide ($AlO_x$) or titanium oxide ($TiO_x$), or a polycrystalline film, such as manganese oxide (MgO). In embodiments where an MTJ element is used, the tunnel barrier layer 116 is thin enough to allow quantum mechanical tunneling of current between the reference layer 115 and the free layer 117. In some embodiments, the tunnel barrier layer 116 may have a thickness ranging from approximately 0.6 nm to approximately 1.2 nm.

In some embodiments, a MgO film is used as the tunnel barrier layer 116. The MgO film of the tunnel barrier layer 116 acts as a PMA promotion layer which collaborates with the Mo film 214 of the reference layer 115 to facilitate the sandwiched Fe—B film 216 of the reference layer 115 to exhibit a strong insitu PMA. In addition, the MgO film of the tunnel barrier layer 116 exhibits a simple-cubic crystalline texture after deposition, and may induce a transformation from amorphous to polycrystalline phases also with a crystalline texture in its underlying Fe—B film of the reference layer 115 during annealing. Coherent tunneling will occur, thereby increasing the TMR coefficient.

The free layer 117 is disposed over the tunnel barrier layer 116. The free layer 117 is capable of changing its magnetization direction between one of two magnetization states, which correspond to binary data states stored in a memory cell. For example, in a first state, the free layer 117 can have a magnetization direction in which the magnetization of the free layer 117 is aligned in parallel with the magnetization direction of the reference layer 115, thereby providing the MTJ element 102 with a relatively low resistance. In a second state, the free layer 117 can have a magnetization direction which is aligned antiparallel with the magnetization direction of the ferromagnetic reference layer 115, thereby providing the MTJ element 102 with a relatively high resistance. In some embodiments, the free layer 117 may be depicted as a single layer. In other embodiments, the free layer 117 may be a multilayer. In some embodiments, the free layer 117 may include two ferromagnetic layers separated by a nonmagnetic layer. In some embodiments, the free layer 117 includes a first ferromagnetic layer 222 disposed over the tunnel barrier layer 116, a nonmagnetic layer 224 disposed over the first ferromagnetic layer 222 and a second ferromagnetic layer 226 disposed over the nonmagnetic layer 224. In some embodiments, the free layer 117 may include an iron-boron (Fe—B) film 222, a manganese (Mg) film 224 and a cobalt-iron-boron (Co—Fe—B) film 226. In some embodiments, a thickness of the Fe—B film 222 is within a range of approximately 0.8 nm to approximately 1.2 nm, a thickness of the Mg film 224 is within a range of approximately 0.3 nm to approximately 0.5 nm, and a thickness of the Co—Fe—B film 226 is within a range of approximately 0.4 nm to approximately 0.8 nm.

The MgO film of the tunnel barrier layer 116 also acts as a PMA promotion layer which collaborates with the Mg film 224 of the free layer 117 to facilitate the sandwiched Fe—B film 222 of the free layer 117 to exhibit a strong insitu PMA. In addition, the MgO film of the tunnel barrier layer 116 may also induce a transformation from amorphous to polycrystalline phases also with a [001] crystalline texture in its overlying Fe—B film 222 of the free layer 117 during annealing. Coherent tunneling will occur, thereby increasing the TMR coefficient.

Figure 2B:
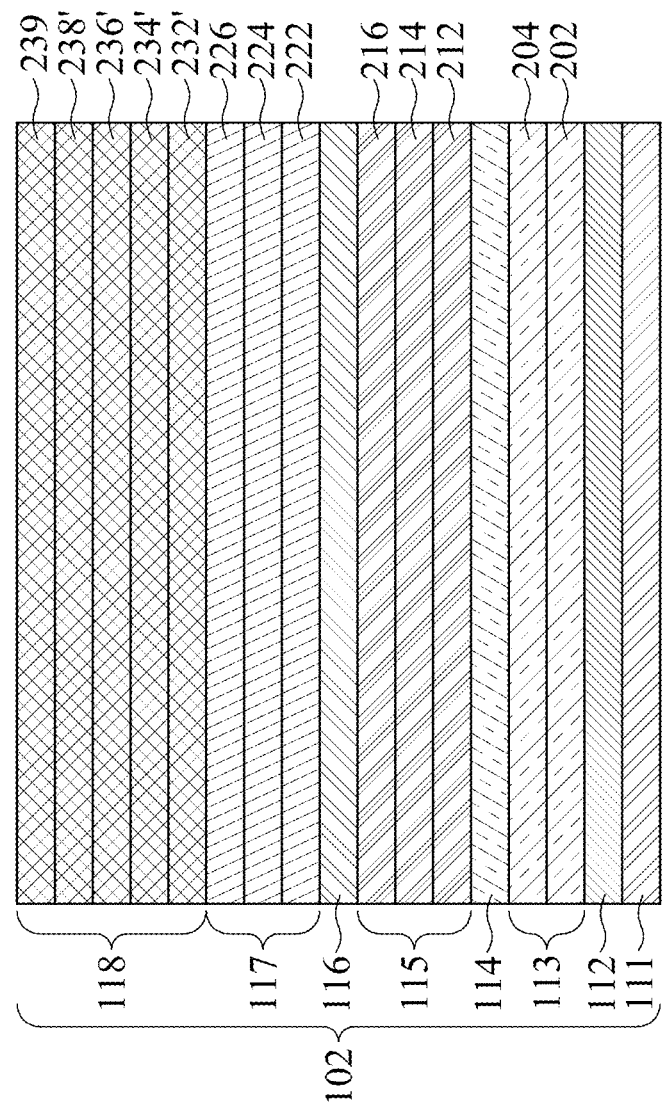
FIG. 2B illustrates a cross-sectional view of some comparative embodiments of an MTJ element according to the present disclosure.

FIG. 2B illustrates a cross-sectional view of some comparative embodiments of an MTJ element according to the present disclosure. The MTJ element of FIG. 2B has a structure similar to that of FIG. 2A except that the configuration of the cap layer 118.

Referring to FIG. 2B, the cap layer 118 is disposed over the free layer 117. The cap layer 118 may include a first cap layer 232' formed of a dielectric MgO film disposed over the free layer 117, a second cap layer 234' formed of a ferromagnetic Co—Fe—B film disposed over the first cap layer 232', a third cap layer 236' formed of a nonmagnetic Ru film disposed over the second cap layer 234', a fourth cap layer 238' formed of a nonmagnetic Ta film disposed over the third layer 236', and a fifth cap layer 239 formed of a nonmagnetic Ru film disposed over the fourth layer 236'.

The MgO film used as the first cap layer 232' may have a thickness ranging from approximately 0.4 nm to approximately 1 nm. It also acts as a perpendicular-magnetic-anisotropy (PMA) promotion layer which collaborates with the manganese (Mg) film 224 to facilitate the sandwiched Co—Fe—B film 226 to exhibit a strong PMA. As a result, the free layer 117 exhibits a strong PMA. In some embodiments, to ensure the strong PMA, the MgO film used as the first cap layer 232' has an oxygen content close to or substantially equivalent to that used as the tunnel barrier layer 116 so as to minimize oxygen chemical potentials between the two MgO films (i.e., 116, 232'), which will lead of substantial oxygen diffusion inside the free layer 117. In some embodiments, oxygen diffusion induced by a large oxygen chemical potential between the two MgO films may cause an increase in the resistance of the MTJ element 102 from 6.3 Ω-cm² to beyond 9.8 Ω-cm², and a decrease in the TMR coefficient of the MTJ element 102 from 132% to 108% or lower.

The Co—Fe—B film used as the second cap layer 234' may have a thickness ranging from approximately 0.4 nm to approximately 0.8 nm. The Ru film used as the third cap layer 236' may have a thickness ranging from approximately 1 nm to approximately 3 nm. The Ta film used as the fourth cap layer 238' may have a thickness ranging from approximately 1 nm to approximately 3 nm. The Ru film used as the fifth cap layer 239' may have a thickness ranging from approximately 3 nm to approximately 5 nm.

The Ta film used as the fourth cap layer 238' has a high affinity to oxygen atoms, and may trap oxygen gases during annealing, thereby protecting the MTJ element 102 from oxygen penetration from ambient processing environments. Without such protection, the oxygen penetration may result in a very high RA and a very low TMR coefficient.

However, in the present disclosure, it is found that the use of the Ta film 238' seems to pose some problems. First, it may also trap oxygen atoms in the MgO film used as the first cap layer 232' through the Ru film used as the third cap layer 236' and the Co—Fe—B film used as the second cap layer 234', both of which are not good diffusion barrier layers at all, thus varying the oxygen chemical potentials between the two MgO films (i.e., 116, 232') and deteriorating TMR properties. Second, it may also even trap oxygen atoms in the MgO film used as the tunnel barrier layer 116 through the free layer 117, which is not a good diffusion barrier layer, either, thus also varying the oxygen chemical potentials between the two MgO films (i.e., 116, 232') and deteriorating TMR properties. Third, Ta atoms may penetrate into the underlying layers, leading to a loss of magnetic moments of the free layer 117 and thus deteriorating the TMR properties. Due to these concerns, the Ta (W or Mo also having a high affinity to oxygen atoms) film used as a spacer layer 224 in the free layer 117 is thus replaced by an Mg film. Fourth, in the junction formation process of the MTJ element 102, Ta atoms etched away may be re-deposited on junctions and react with oxygen gases to form TaOx at the junctions, leading to concerns on electrical shorting.

Referring back to FIG. 2A, in the embodiments according to the present disclosure, the Co—Fe—B film of the second cap layer 234' (or the Co—Fe—B film of the second cap layer 234' together with the Ru film of the third cap layer 236') is replaced by a cap layer 118 which acts as a diffusion barrier layer. In some embodiments, the diffusion barrier layer has an amorphous phase and does not provide Ta and oxygen atoms with grain boundaries as diffusion paths. In some embodiments, the diffusion barrier layer is nonmagnetic so that it will not induce unwanted stray fields to interrupt the operation of the MTJ element 102. In some embodiments, the diffusion barrier layer includes an amorphous, nonmagnetic film of the form X-Z (where X is iron (Fe), cobalt (Co), or the like, and Z is hafnium (Hf), yttrium (Y), zirconium (Zr), or the like). In some embodiments, the diffusion barrier layer includes a Co—Hf film with an Hf content ranging from 18 atomic percentage (at. %) to 40 at. % (e.g., 18 at. %, 20 at. %, 25 at. %, 30 at. %, 35 at. % or 40 at. %). The Co—Hf film may have an Co content ranging from 60 at. % to 82 at. % (e.g., 60 at. %, 65 at. %, 70 at. %, 75 at. %, 80 at. % or 82 at. %).

It is found that the use of the Co—Hf film in the cap layer 118 can prevent the atoms (such as oxygen) from diffusing out from the MTJ element 102 and being recaptured by the tantalum (Ta), tungsten (W) or molybdenum (Mo) film which may affect the performance of the MTJ element or cause electrical shorting or electrical opening. On the other hand, it can also prevent diffusion of diffusive species, such as tantalum (Ta) or ruthenium (Ru) from the top electrode from or other layers into the MTJ element 102.

In some embodiments, other atoms such as nitrogen (N) or chromium (Cr) may be doped in or alloyed with the Co—Hf film. In other words, the Co—Hf film may have a nitrogen content ranging from 0 at. % to 30 at. % or a chromium content ranging from 0 at. % to 20 at. %. The presence of nitrogen (N) and/or chromium in the Co—Hf film may further inhibit the formation of unwanted magnetic moments during the annealing process. In some embodiments, the Co—Hf film may have a thickness ranging from 1 nm to 10 nm, or from 4 nm to 8 nm.

In some embodiments, the cap layer 118 may be depicted as a single layer. In other embodiments, the cap layer 118 may be a multilayer. The cap layer 118 can include any number of layers in any order with many allowable materials and thicknesses and thus FIG. 2A is merely an example. In some embodiments, the cap layer 118 may further include a magnesium oxide (MgO) layer 232 disposed below the Co—Hf film (i.e., Co—Hf layer 234) and over the free layer 117 as illustrated in FIG. 2A. In some embodiments, the MgO layer 232 may have a thickness ranging from approximately 0.6 nm to approximately 1 nm. The free layer 117 is sandwiched by two magnesium oxide (MgO) films 116 and 232 and protected by the Co—Hf layer 234. In some embodiments, the cap layer 118 may include an additional cap layer 236 or 238 disposed over the Co—Hf film 234 as illustrated in FIG. 2A. Each of the additional cap layers 236 or 238 can be independently included in the cap layer 118 or the additional cap layers 236 and 238 can be both included in the cap layer 118. The additional cap layer 236 may include molybdenum (Mo), or tungsten (W), or nickel-chromium (Ni—Cr). The additional cap layer 238 may include tantalum (Ta) or ruthenium (Ru). In some embodiments, each of the additional cap layers 236 and 238 may have a thickness ranging from approximately 1 nm to approximately 10 nm.

In some embodiments as illustrated in FIG. 2A, the cap layer 118 may include a first cap layer 232 formed of a MgO film disposed over the free layer 117, a second cap layer 234 formed of a Co—Hf film disposed over the first cap layer 232, a third cap layer 236 formed of a Ni—Cr film disposed over the second cap layer 234 and a fourth cap layer 238 formed of a nonmagnetic Ru film disposed over the third cap layer 236.

The Ta film used as the fourth cap layer 238' in the comparative embodiments can be eliminated or replaced by a low-resistivity film, such as a Ni—Cr film illustrated in some embodiments according to the present disclosure as the third cap layer 236. The Ni—Cr film has a high affinity to oxygen atoms and a capability of trapping oxygen gases during annealing, thereby protecting the MTJ element 102 from oxygen penetration from ambient processing environments. In some embodiments, the third cap layer 236 may include a nickel-chromium (Ni—Cr) layer in a thickness of approximately 6 nm. The Cr content in the third cap layer 236 may range from approximately 30 at. % to approximately 50 at. %. In some embodiments, the Cr content in the third cap layer 236 is high enough to form a nonmagnetic third cap layer 236.

In some embodiments, a Ta-free MTJ structure is "sealed" between two Co—Hf films, one used in a buffer layer 111 and the other used in a cap layer 118. Unlike Fe—B and Co—Fe—B films which exhibit a "soft" amorphous phase which will be transformed into a polycrystalline phase during annealing at a temperature exceeding 300° C., the Co—Hf films exhibit a "hard" amorphous phase which will remain as it is during annealing at a high temperature, such as at 400° C., for a long time period, such as 5 hours.

In some embodiments, with the use of a diffusion barrier layer (specifically, a Co—Hf film) in the cap layer, the present disclosure achieves at least one of the following advantages: a decrease in the resistance of the MTJ element 102 (e.g., from 6.4 Ω-cm$^2$ to 5.9 Ω-cm$^2$) and an increase in the TMR coefficient of the MTJ element 102 (e.g., from 124% to 127%). With a low resistance, low voltages can be applied to the transistor 104 for a low write current to perform low-power write operations. With a high TMR coefficient, a separation between codes "0" and "1" will be large enough to minimize a bit-error-rate (BER) when performing read operations.

Figure 3:
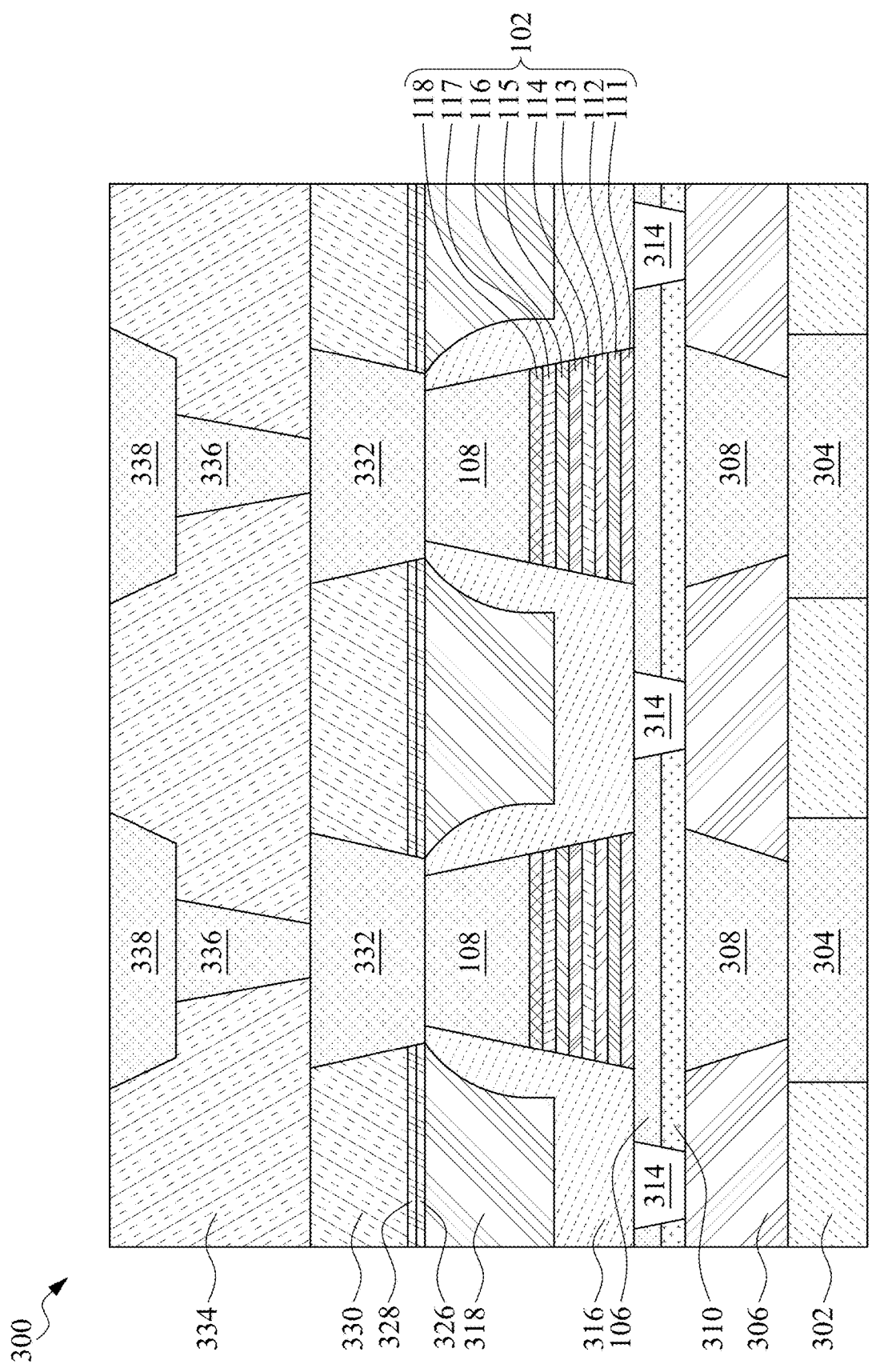
FIG. 3 illustrates a cross sectional view of some embodiments of a memory device according to the present disclosure.

FIG. 3 illustrates a cross sectional view of some embodiments of a memory device 300, which includes MTJ elements 102. The memory device includes a lower conductive wire 304 disposed within a first inter-level dielectric (ILD) layer 302, a second ILD layer 306 disposed over the first ILD layer 302, a lower interconnect via 308 disposed over the lower conductive wire 304, a diffusion barrier layer 310 disposed over the lower interconnect via 308, a bottom electrode 106 disposed over the diffusion barrier 310 and an insulator layer 314 disposed over the second ILD layer 306. The MTJ elements 102 are disposed between the bottom electrode 106 and a top electrode 108. The bottom electrode 106 and the top electrode 108 are conductive, and may include, for example, metals, metal nitrides, or other suitable conductive materials. For example, but not limited thereto, the bottom electrode 106 and the top electrode 108 can include tantalum (Ta), tantalum nitride (TaN), titanium nitride (TiN), tungsten (W), tungsten nitride (WN), platinum (Pt), palladium (Pd), iridium (Ir), nickel-chromium (Ni—Cr), zirconium (Zr), or niobium (Nb). In some embodiments, the lower interconnect via 308 and the conductive wire 304 include metal, such as copper or tungsten (W).

The MTJ element 102 includes a buffer layer 111, a seed layer 112 over the buffer layer 111, a hard bias layer 113 over the seed layer 112, an antiparallel coupling (APC) layer 114 over the hard bias layer 113, a reference layer 115 over the APC layer 114, a tunnel barrier layer 116 over the reference layer 115, a free layer 117 over the tunnel barrier layer 116, and a cap layer 118 over the free layer 117. The cap layer 118 is disposed between the top electrode 108 and the free layer 117. The cap layer 118 is amorphous and includes a Co—Hf film as discussed above. The cap layer 118 prevents the atoms (such as oxygen) from diffusing out from the MTJ element and being captured by tantalum (Ta), tungsten (W) or molybdenum (Mo) contained in the top electrode 108 or its overlying layers, and prevents diffusion of a diffusive species (such as Ta, W or Mo) from the top electrode 108 to its underlying layers. Thus, the RA can be reduced and the TMR coefficient can be increased.

A spacer 316 covers sidewalls of the MTJ element 102 and the top electrode 108. In some embodiments, the spacer 316 may also cover a top surface of the bottom electrode 106 and a top surface of the insulator layer 314. In some embodiments, the spacer 316 is formed of silicon nitride. A third ILD layer 318 is disposed over the spacer 316. In some embodiments, the third ILD layer 318 is a tetra-ethyl-ortho-silicate (TEOS) layer. A first dielectric layer 326 is disposed over the third ILD layer 318. In some embodiments, the first dielectric layer 326 is a silicon carbide (SiC) layer. A second dielectric layer 328 is disposed over the first dielectric layer 326. In some embodiments, the second dielectric layer 328 is a TEOS layer. A fourth ILD layer 330 is disposed over the second dielectric layer 328. A top electrode via 332 is disposed over the top electrode 108. A fifth ILD layer 334 is disposed over the fourth ILD layer 330. In some embodiments, the fifth ILD layer 334 is made of a low k dielectric material. A conductive via 336 is disposed over the top electrode via 332. A conductive wire 338 is disposed over the conductive via 336. In some embodiments, the conductive wire 338 and the conductive via 336 include metal, such as copper or aluminum.

FIGS. 4-11 illustrate cross-sectional views 400 to 1100 of some embodiments of a method of forming a memory device according to the present disclosure.

Figure 4:
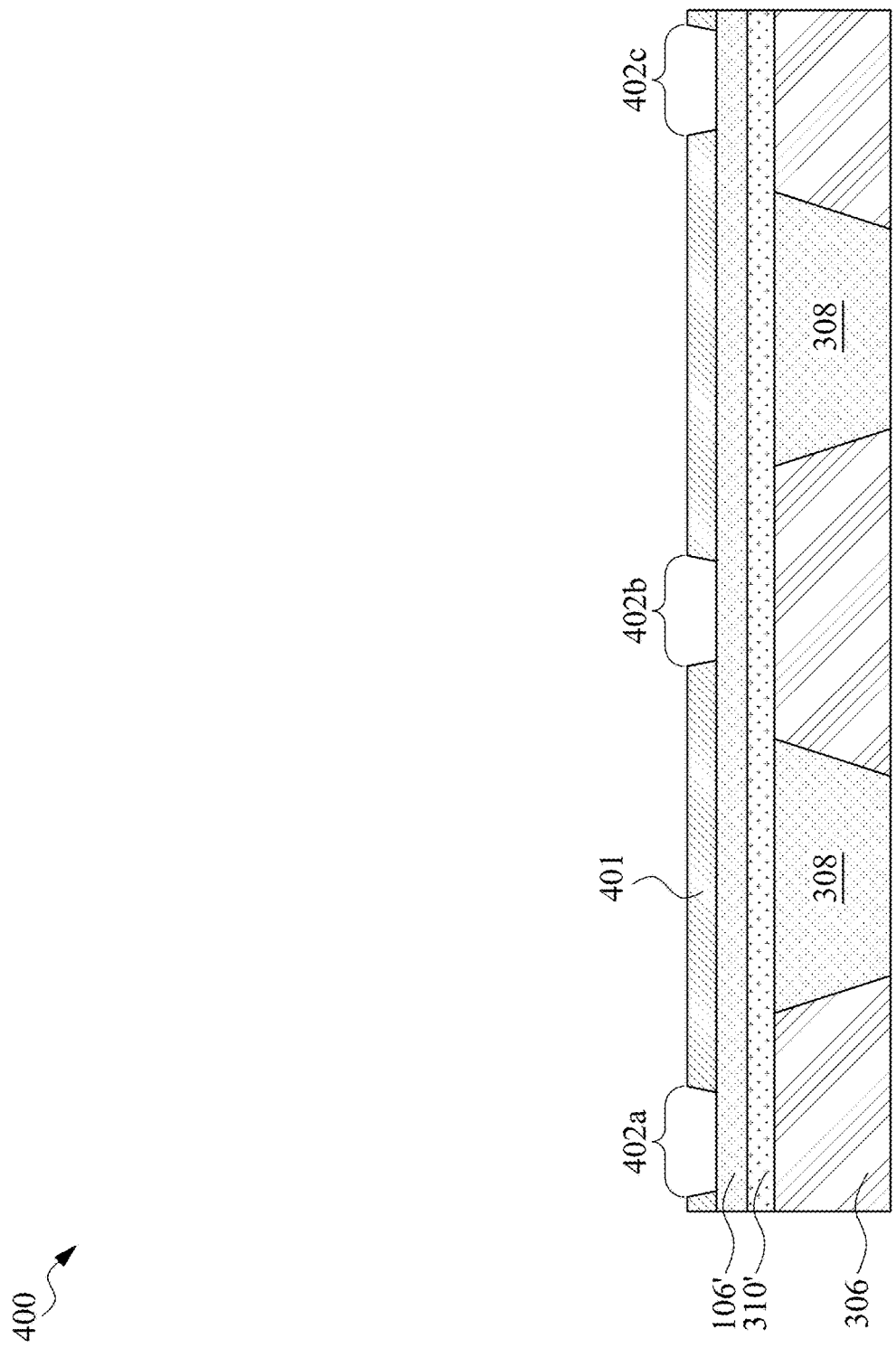
FIGS. 4-11 illustrate cross-sectional views of some embodiments of a method of forming a memory device according to the present disclosure.

As shown in a cross-sectional view 400 of FIG. 4, an interconnect via 308 is formed within a second ILD layer 306. A diffusion barrier layer 310' is formed over the second ILD layer 306. A bottom electrode layer 106' is formed over the diffusion barrier layer 310'. A masking layer 401 is formed over the bottom electrode layer 106'. The masking layer 401 defines one or more openings 402a, 402b and 402c above a top surface of the bottom electrode layer 106'.

Figure 5:
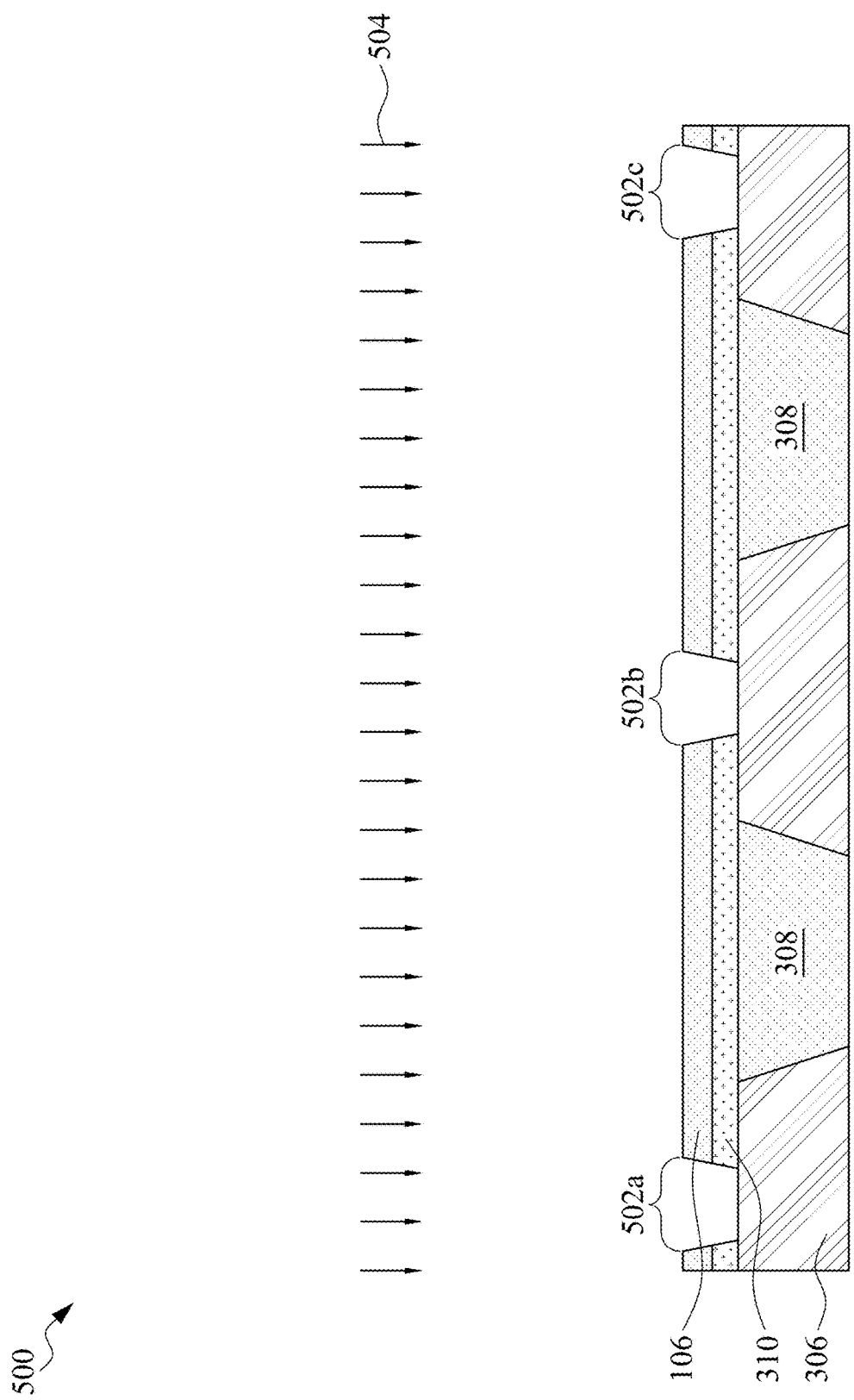

As shown in a cross-sectional view 500 of FIG. 5, an etching process is performed to etch the masking layer 401, the bottom electrode layer 106', and the diffusion barrier layer 310' and then a bottom electrode 106 and a diffusion barrier layer 310 defined by openings 502a, 502b and 502c are formed. In some embodiments, an etchant 504 is used.

Figure 6:
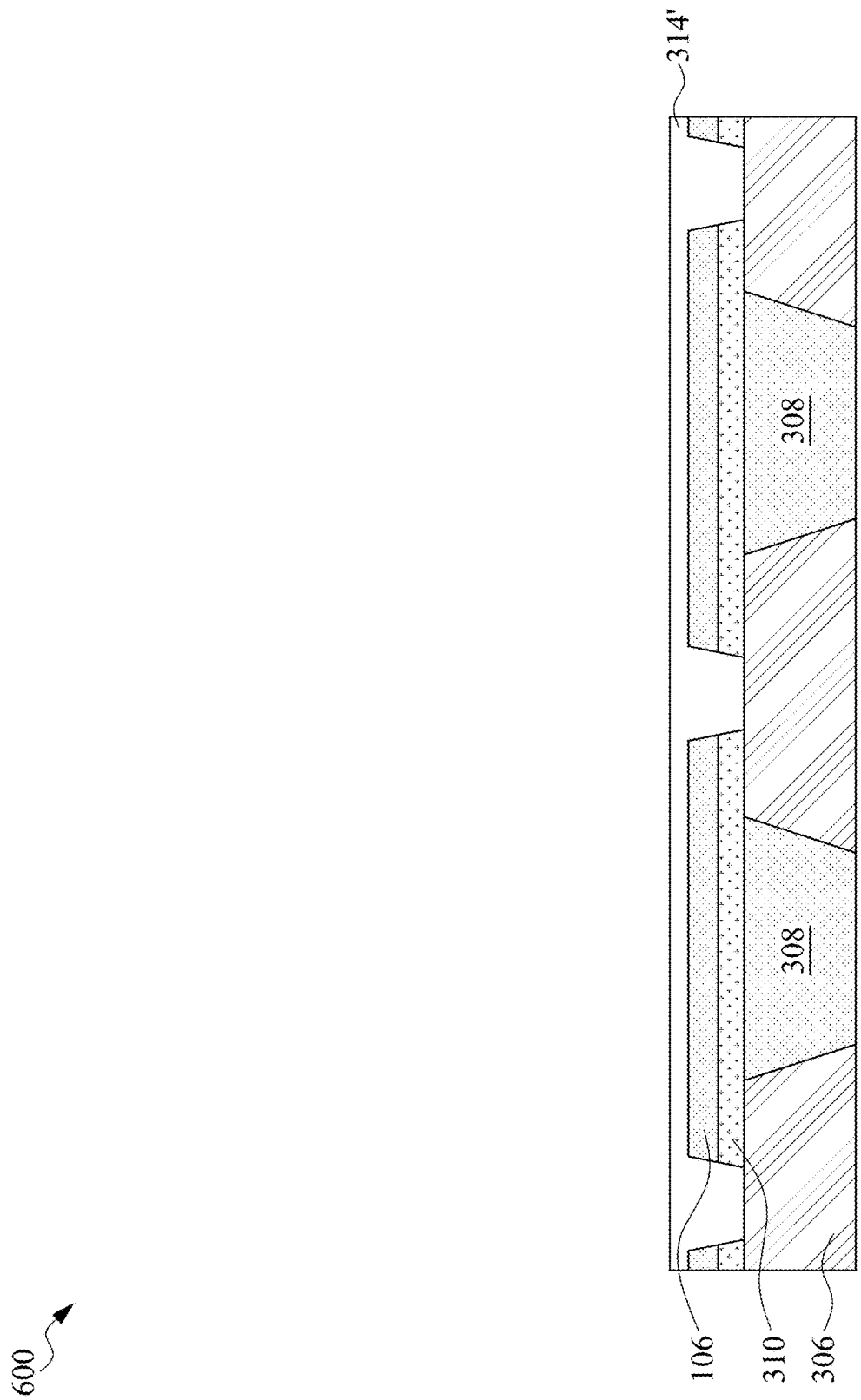

As shown in a cross-sectional view 600 of FIG. 6, an insulator layer 314' is formed over the bottom electrode 106. The insulator layer 106 fills the openings 502a, 502b and 502c shown in FIG. 5.

Figure 7:
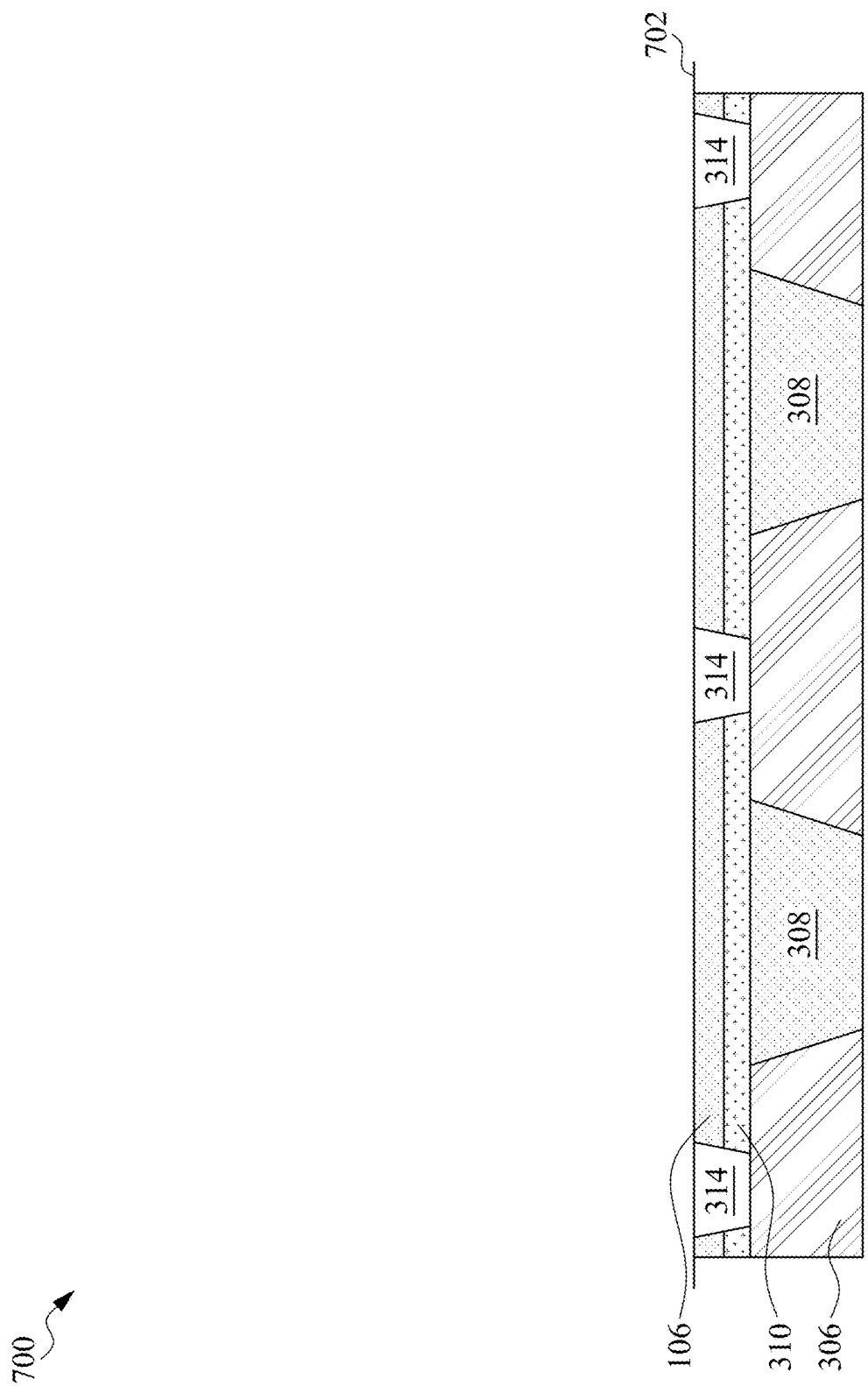

As shown in a cross-sectional view 700 of FIG. 7, a chemical mechanical planarization (CMP) process is performed along line 702. The CMP process removes a portion of the insulator layer 314' shown in FIG. 6 and forms an insulator layer 314 shown in FIG. 7.

Figure 8:
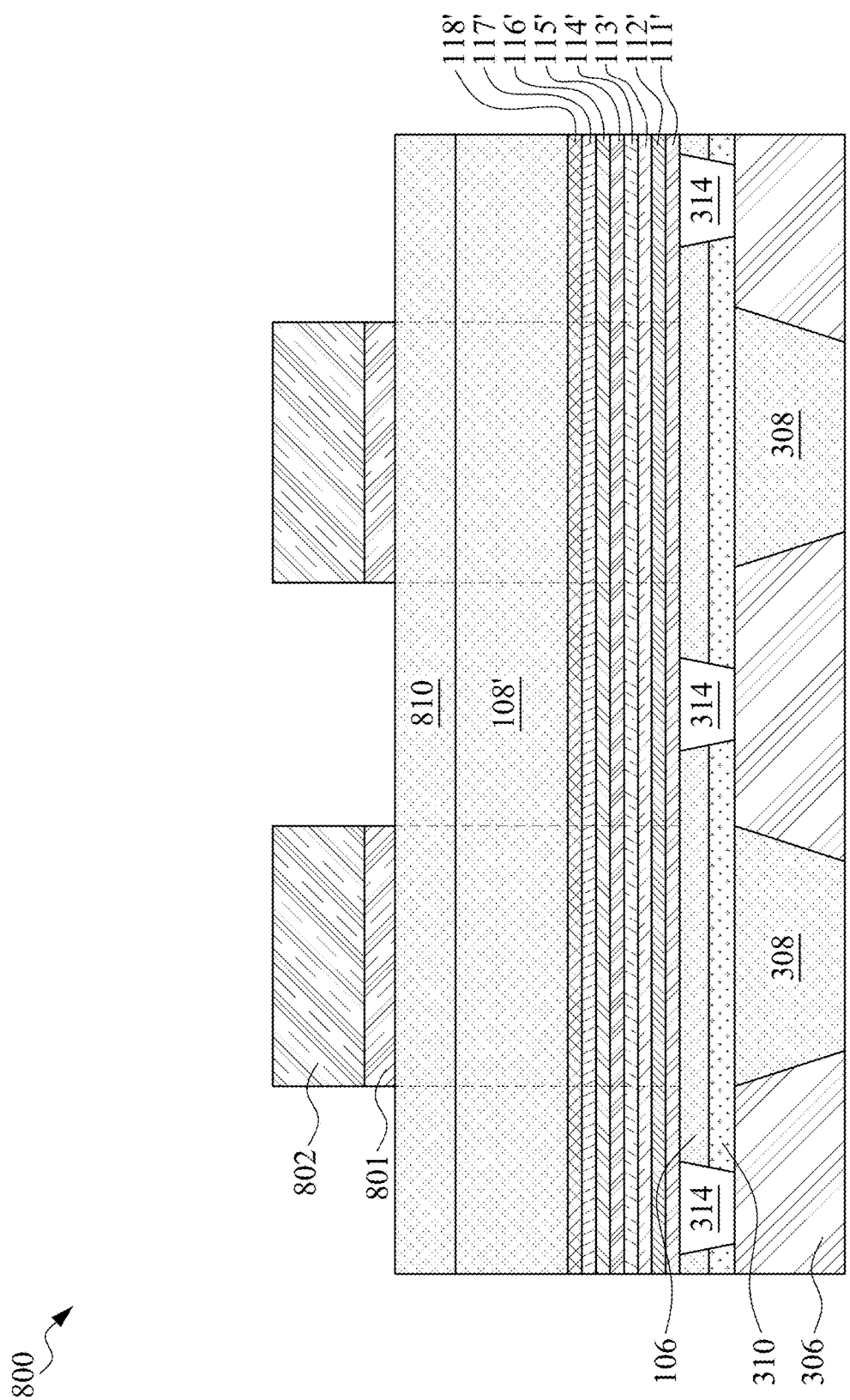

As shown in a cross-sectional view 800 of FIG. 8, a buffer layer 111', a seed layer 112', a hard bias layer 113', an APC layer 114', a reference layer 115', a tunnel barrier layer 116' and a free layer 117' are formed over the bottom electrode 106. A cap layer 118' is formed over the free layer 117' and a top electrode layer 108' is formed over the cap layer 118'. A hard mask layer 810 is formed over the top electrode layer 108'. A masking layer 801 and photoresist 802 are formed over the hard mask layer 810. The masking layer 801 and photoresist 802 are patterned and cover a portion of the hard mask layer 810.

Figure 9:
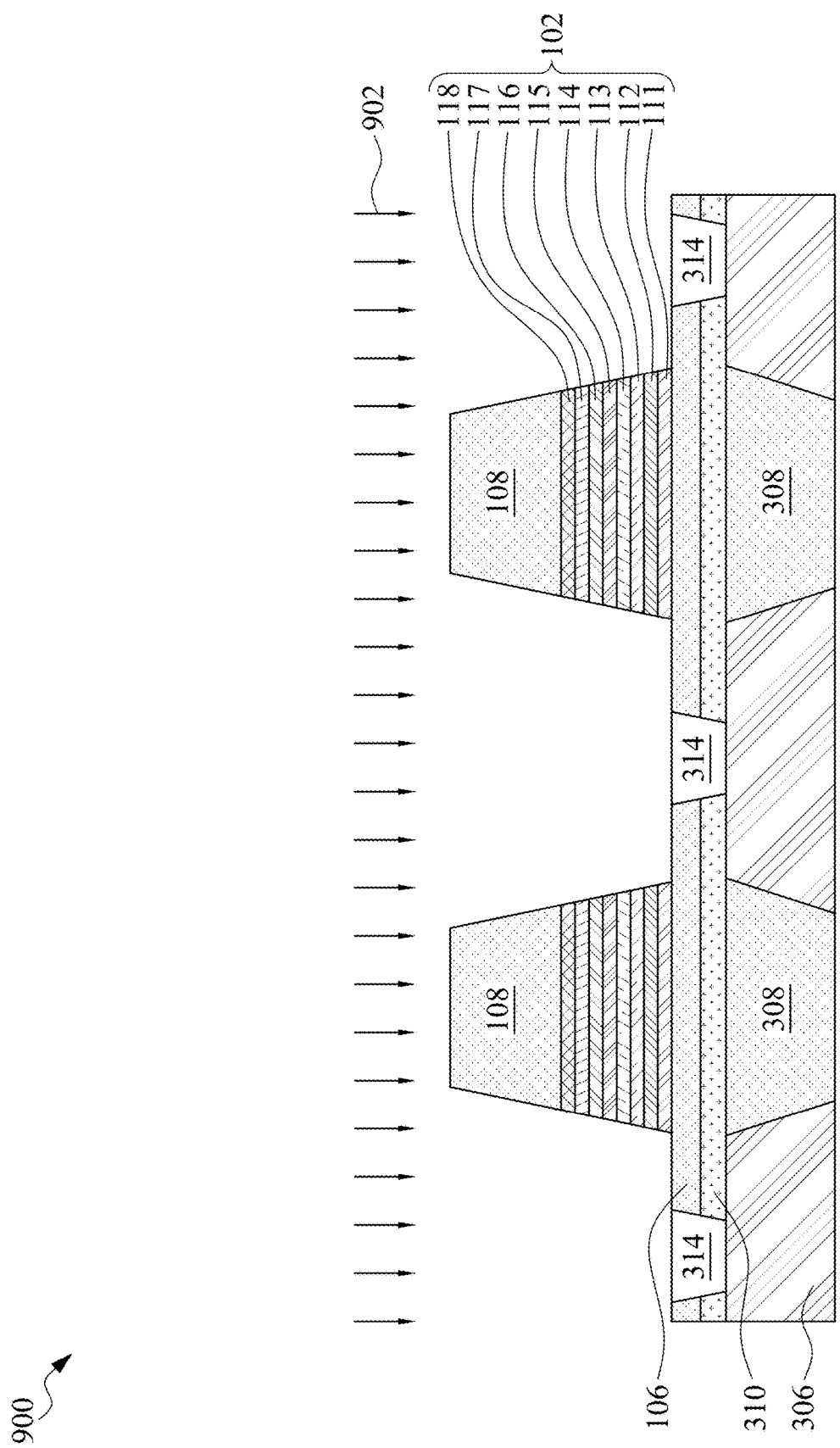

As shown in a cross-sectional view 900 of FIG. 9, an etching process is performed using an etchant 902 to remove the portion of the underlying layers which are uncovered by the masking layer 801 so as to transfer the pattern of the masking layer 801 to the underlying layers. The etching process also removes the hard mask layer 810, the masking layer 801 and photoresist 802. Then MTJ elements 102 including a buffer layer 111, a seed layer 112, a hard bias layer 113, an APC layer 114, a reference layer 115, a tunnel barrier layer 116 and a free layer 117 and a cap layer 118 are formed and sandwiched between the bottom electrode 106 and the top electrode 108.

Figure 10:
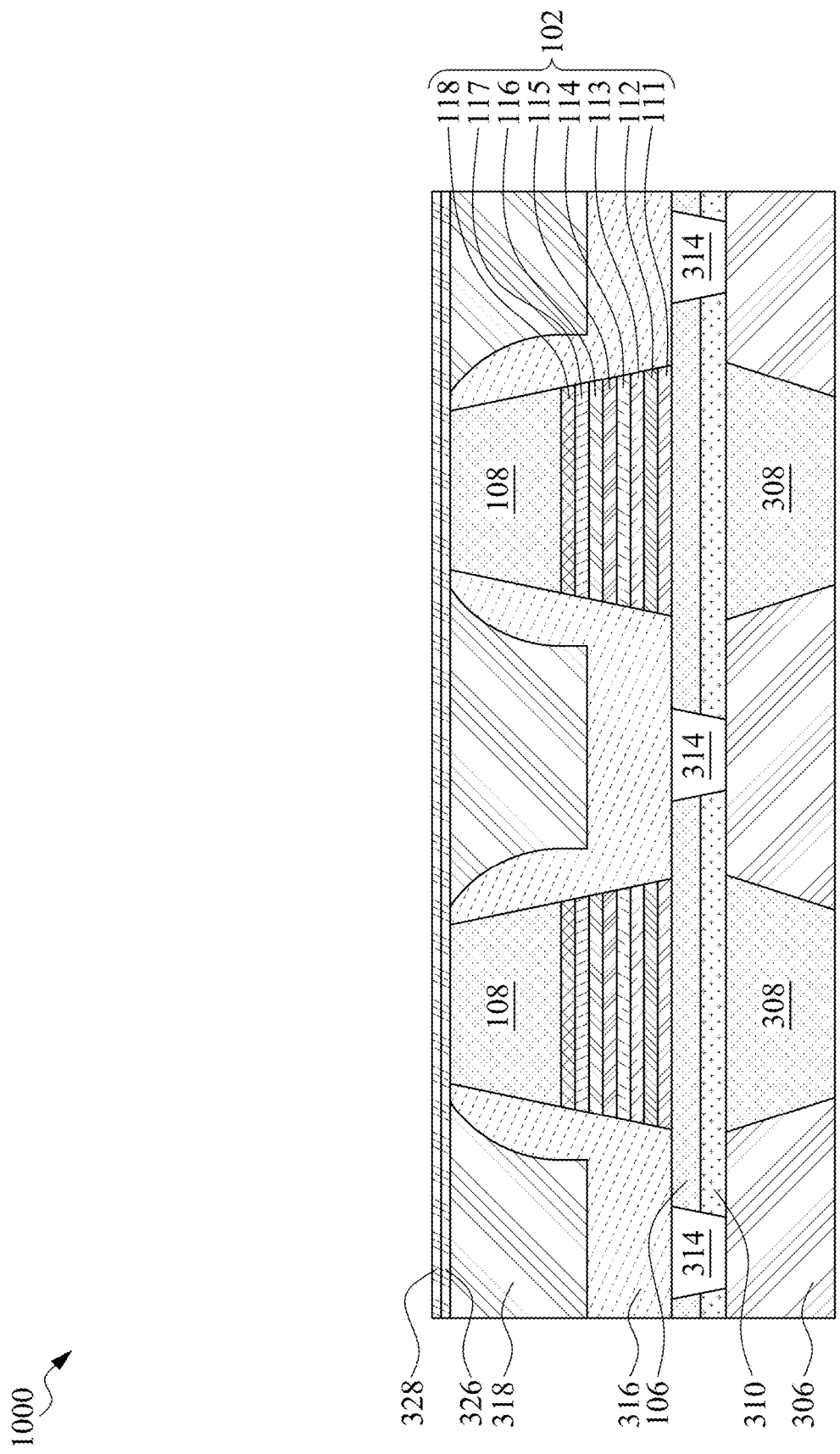

As shown in a cross-sectional view 1000 of FIG. 10, a spacer 316 is formed over the bottom electrode 106 and covers the sidewalls of the top electrode 108 and the MTJ element 102. A third ILD layer 318 is formed over the spacer 316. A first dielectric layer 326 is formed over the second ILD layer 318. A second dielectric layer 328 is formed over the first dielectric layer 326.

Figure 11:
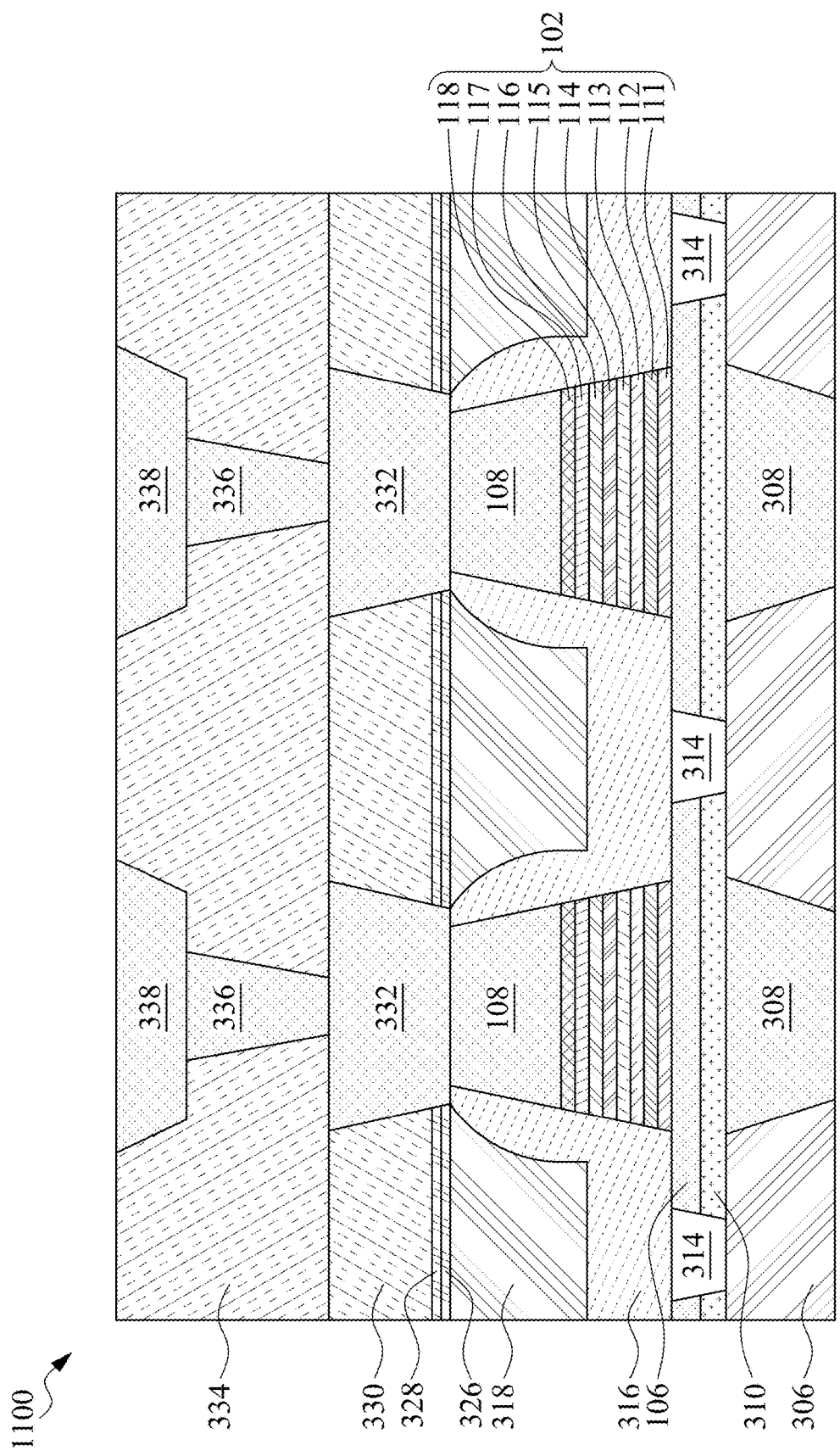

As shown in a cross-sectional view 1100 of FIG. 11, a fourth ILD layer 330 is formed over the second dielectric layer 328. A top electrode via 332 is formed over the top electrode 108. A fifth ILD layer 334 is formed over the fourth ILD layer 330. A conductive via 336 is formed over the top electrode via 332. A conductive wire 338 is formed over the conductive via 336.

Figure 12:
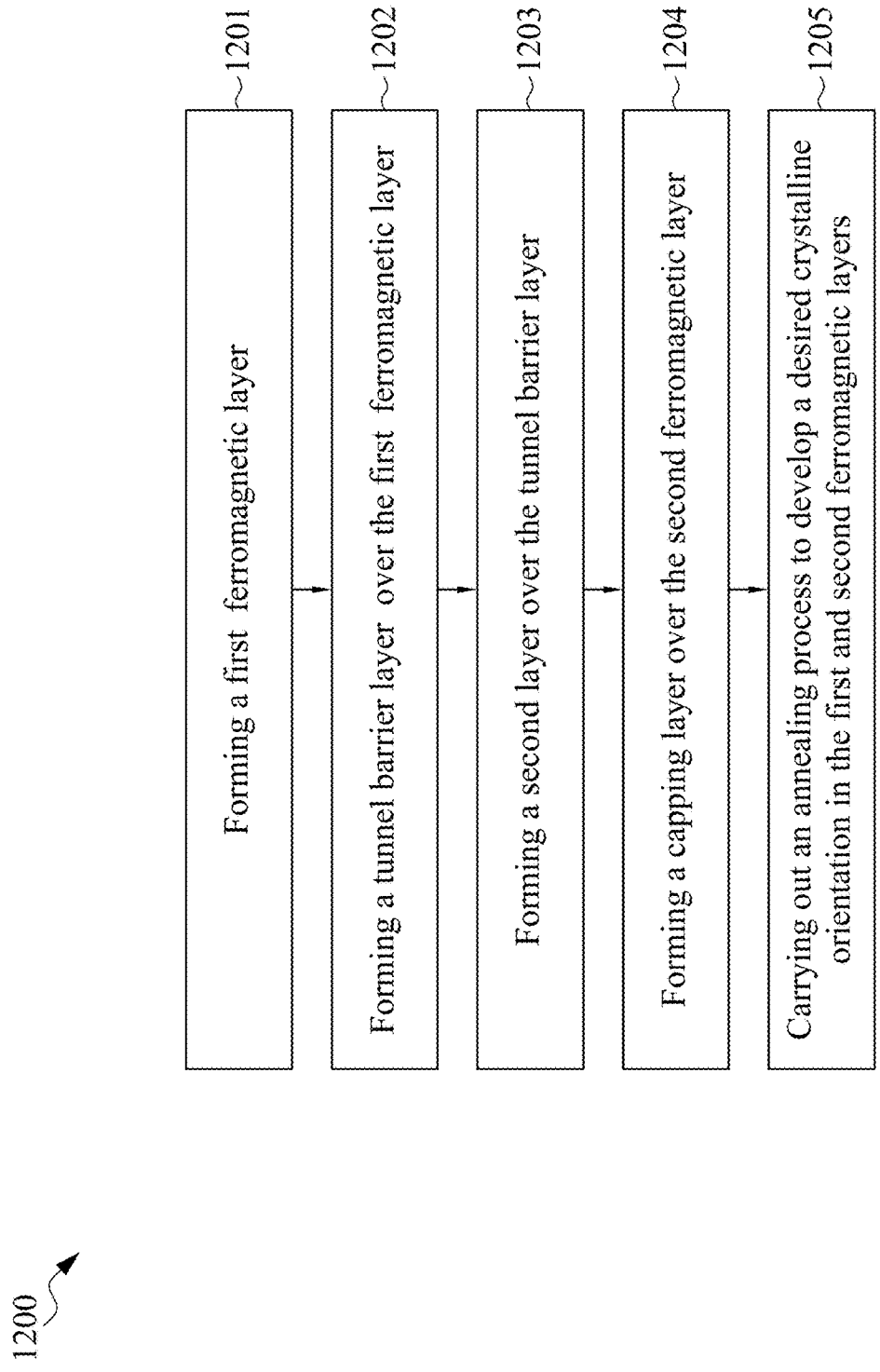
FIG. 12 illustrates a flowchart representing a method for forming a MTJ element according to the present disclosure.

The method for forming the MTJ element 102 will be described according to one or more embodiments. FIG. 12 is a flowchart representing a method 1200 for forming a MTJ element according to aspects of the present disclosure. The method 1200 includes a number of operations. It should be noted that the operations of the method 1200 for forming the MTJ element may be rearranged or otherwise modified within the scope of the various aspects. It should further be noted that additional operations may be provided before, during, and after the method 1200, and that some other operations may only be briefly described herein. Thus, other implementations are possible within the scope of the various aspects described herein.

At operation 1201, a first ferromagnetic layer is formed over a bottom electrode. In some embodiments, the first ferromagnetic layer is amorphous. In some embodiments, a stack of layers including a buffer layer, a seed layer, a hard bias layer and an APC layer is formed on the bottom electrode prior to operation 1201. In some embodiments, the first ferromagnetic layer may be formed by using one or more deposition methods such as, CVD, PVD, atomic layer deposition (ALD), or the like.

At operation 1202, a tunnel barrier layer is formed over the first ferromagnetic layer. In some embodiments, the tunnel barrier layer has a (001) orientation. In some embodiments, the tunnel barrier layer may be formed by using one or more deposition methods such as, CVD, PVD, atomic layer deposition (ALD), or the like.

At operation 1203, a second ferromagnetic layer is formed over the tunnel barrier layer. In some embodiments, the second ferromagnetic layer is amorphous. In some embodiments, the second ferromagnetic layer may be formed by using one or more deposition methods such as, CVD, PVD, atomic layer deposition (ALD), or the like.

At operation 1204, a cap layer is formed over the second ferromagnetic layer. The cap layer may include a stack of cap layers. In some embodiments, the cap layer is formed by depositing a first cap layer of MgO over the second ferromagnetic layer and depositing a second cap layer of CoHf over the first MgO cap layer. The deposition methods may include, but is not limited to, CVD, PVD, atomic layer deposition (ALD), or the like.

At operation 1205, an annealing process is carried out to develop a desired crystalline orientation in the first and second ferromagnetic layers. In some embodiments, the first and second ferromagnetic layers have the same crystalline orientation as the tunnel barrier layer after the annealing process. The annealing may be carried out at a high temperature, such as 350° C. or above. Furthermore, a top electrode may be formed before or after operation 1205 and an etching process can be carried out after the formation of the tope electrode by a reactive ion etching (RIE) and/or an ion beam etching (IBE), or any suitable method. Thus, an MTJ element 102 can be formed and sandwiched by the top electrode and the bottom electrode.

Accordingly, the present disclosure provides an MTJ element including a diffusion carrier layer as a cap layer, a semiconductor device including the MTJ element and a method for forming the MTJ element. In some embodiments, the cap layer includes an amorphous, nonmagnetic film of a form X-Z, where X is Fe or Co and Z is Hf, Y, or Zr. The resulting MTJ element has a lower RA and a greater TMR coefficient. Consequently, write and read performance of the MTJ element is improved.

In some embodiments, the present disclosure relates to a magnetic tunnel junction (MTJ) element. The MTJ element includes a reference layer, a tunnel barrier layer disposed over the reference layer, a free layer disposed over the tunnel barrier layer, and a diffusion barrier layer disposed over the free layer.

In other embodiments, the present disclosure relates to a semiconductor device. The semiconductor device includes a magnetic tunnel junction (MTJ) element sandwiched between a bottom electrode and a top electrode. The magnetic tunnel junction (MTJ) element includes a reference layer over the bottom electrode, a tunnel barrier layer disposed over the reference layer, a free layer disposed over the tunnel barrier layer and a cap layer disposed over the free layer. The cap layer includes an amorphous, nonmagnetic film of a form X-Z, where X is Fe or Co and Z is Hf, Y, or Zr.

In yet other embodiments, the present disclosure relates to a method for manufacturing a magnetic tunnel junction (MTJ) element. The method includes the following operations: forming a first ferromagnetic layer; forming a tunnel barrier layer over the first ferromagnetic layer; forming a second ferromagnetic layer over the tunnel barrier layer; and forming a cap layer over the second ferromagnetic layer. The cap layer includes an amorphous, nonmagnetic film of a form X-Z, where X is Fe or Co and Z is Hf, Y, or Zr.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A magnetic tunnel junction (MTJ) element, comprising:
    a hard bias layer;
    a reference layer disposed over the hard bias layer;
    a tunnel barrier layer disposed over the reference layer;
    a free layer disposed over the tunnel barrier layer; and
    a diffusion barrier layer disposed over the free layer, wherein the diffusion barrier layer comprises an amorphous and nonmagnetic film of a form X-Z, where X is Fe or Co and Z is Hf, Y, or Zr.

2. The magnetic tunnel junction element of claim 1, wherein the diffusion barrier layer comprises a cobalt-hafnium (Co—Hf) film.

3. The magnetic tunnel junction element of claim 2, wherein the Co—Hf film has a Hf content ranging from 18 at % to 40 at %.

4. The magnetic tunnel junction element of claim 2, wherein the Co—Hf film are doped with nitrogen or alloyed with chromium.

5. The magnetic tunnel junction element of claim 1, wherein the MTJ element comprises a cap layer disposed over the free layer and wherein the cap layer comprises the diffusion barrier layer and an MgO cap layer disposed between the diffusion barrier layer and the free layer.

6. The magnetic tunnel junction element of claim 5, wherein the cap layer further comprises a Ni—Cr layer disposed over the diffusion barrier layer.

7. The magnetic tunnel junction element of claim 5, wherein the cap layer comprising the diffusion barrier layer and the MgO cap layer is free of tantalum.

8. The magnetic tunnel junction element of claim 1, wherein the (MTJ) element further comprises an amorphous and nonmagnetic layer disposed below the reference layer.

9. The magnetic tunnel junction element of claim 8, wherein the amorphous and nonmagnetic layer disposed below the reference layer comprises a Co—Hf film.

10. The magnetic tunnel junction element of claim 1, wherein the hard bias layer comprises a multilayer stack comprising N repeats of alternating Co and Pt films, and a Co film disposed over the multilayer stack, wherein N is an integer of 3 to 6.

11. A semiconductor device, comprising:
    a magnetic tunnel junction element sandwiched between a bottom electrode and a top electrode, wherein the magnetic tunnel junction element comprises:
        a hard bias layer over the bottom electrode;
        a reference layer over the hard bias layer;
        a tunnel barrier layer disposed over the reference layer;
        a free layer disposed over the tunnel barrier layer; and
        a cap layer disposed over the free layer;
    wherein the cap layer comprises an amorphous, nonmagnetic film of a form X-Z, where X is Fe or Co and Z is Hf, Y, or Zr.

12. The semiconductor device of claim 11, wherein the amorphous, nonmagnetic film of the cap layer is a Co—Hf film.

13. The semiconductor device of claim 11, wherein the magnetic tunnel junction element further comprises an amorphous, nonmagnetic film of a form X-Z, where X is Fe or Co and Z is Hf, Y, or Zr, disposed below the reference layer.

14. The semiconductor device of claim 11, wherein the reference layer comprises a cobalt (Co) layer, a molybdenum (Mo) layer and an iron-boron (Fe—B) layer.

15. The semiconductor device of claim 11, wherein the tunnel barrier layer comprises aluminum oxide, titanium oxide, or a manganese oxide.

16. The semiconductor device of claim 11, wherein the free layer comprises an iron boron (FeB) layer, a manganese (Mg) layer and a cobalt-iron-boron (Co—Fe—B) layer.

17. The semiconductor device of claim 11, wherein the hard bias layer comprises a multilayer stack comprising N repeats of alternating Co and Pt films, and a Co film disposed over the multilayer stack, wherein N is an integer of 3 to 6.

18. A memory device, comprising:
    a magnetic tunnel junction element sandwiched between a bottom electrode and a top electrode, wherein the magnetic tunnel junction element comprises:
        a hard bias layer over the bottom electrode;
        a reference layer over the hard bias layer;
        a tunnel barrier layer disposed over the reference layer;
        a free layer disposed over the tunnel barrier layer; and
        an amorphous diffusion barrier layer disposed over the free layer, wherein the amorphous diffusion barrier layer comprises a nonmagnetic film of a form X-Z, where X is Fe or Co and Z is Hf, Y, or Zr; and
    a spacer layer over sidewalls of the magnetic tunnel junction element and the top electrode.

19. The memory device of claim 18, wherein the diffusion barrier layer includes a Co—Hf film with an Hf content ranging from 18 at. % to 40 at. %.

20. The memory device of claim 18, wherein the hard bias layer comprises a multilayer stack comprising N repeats of alternating Co and Pt films, and a Co film disposed over the multilayer stack, wherein N is an integer of 3 to 6.

* * * * *